United States Patent
Crowley et al.

(10) Patent No.: US 6,198,163 B1
(45) Date of Patent: Mar. 6, 2001

(54) THIN LEADFRAME-TYPE SEMICONDUCTOR PACKAGE HAVING HEAT SINK WITH RECESS AND EXPOSED SURFACE

(75) Inventors: Sean Timothy Crowley, Phoenix; Bradley David Boland, Mesa, both of AZ (US)

(73) Assignee: Amkor Technology, Inc., Chadler, AZ (US)

( * ) Notice: Subject to any disclaimer, the term of this patent is extended or adjusted under 35 U.S.C. 154(b) by 0 days.

(21) Appl. No.: 09/420,065

(22) Filed: Oct. 18, 1999

(51) Int. Cl.$^7$ ............................ H01L 23/10; H01L 23/34; H01L 29/40; H01L 23/48; H05K 7/20

(52) U.S. Cl. .................... 257/706; 257/707; 257/712; 257/675; 257/796; 257/717; 257/725; 361/799; 361/800; 361/707; 361/761

(58) Field of Search ...................... 257/712, 646, 257/675, 713, 717, 720, 796, 676, 622, 484, 708, 730, 664, 725; 361/707, 761, 799, 800

(56) References Cited

U.S. PATENT DOCUMENTS

| | | | |
|---|---|---|---|
| 3,930,114 | 12/1975 | Hodge | 174/52 FP |
| 4,470,507 * | 9/1984 | Burns | 206/330 |
| 5,091,341 * | 2/1992 | Asada et al. | 29/827 |
| 5,278,446 * | 1/1994 | Nagaraj et al. | 257/707 |
| 5,318,042 | 6/1994 | Lerner et al. | 257/712 |
| 5,334,872 | 8/1994 | Ueda et al. | 257/675 |
| 5,442,234 * | 8/1995 | Liang | 257/675 |
| 5,486,720 * | 1/1996 | Kierse | 257/713 |
| 5,506,446 * | 4/1996 | Hoffman et al. | 257/674 |
| 5,519,576 | 5/1996 | Moore | 361/723 |
| 5,583,372 * | 12/1996 | Higgins, III | 257/707 |
| 5,594,234 | 1/1997 | Carter, Jr. et al. | 257/676 |
| 5,619,070 * | 4/1997 | Kozono | 257/692 |
| 5,639,694 | 6/1997 | Diffenderfer et al. | 437/209 |
| 5,646,831 * | 7/1997 | Manteghi | 361/813 |
| 5,650,592 * | 7/1997 | Cheskis et al. | 174/52.4 |
| 5,691,567 * | 11/1997 | Lo et al. | 257/675 |
| 5,701,034 * | 12/1997 | Marrs | 257/706 |
| 5,757,070 * | 5/1998 | Fritz | 257/675 |
| 5,796,160 * | 8/1998 | Kozono | 257/675 |
| 5,801,435 * | 9/1998 | Otsuki | 257/675 |
| 5,804,468 * | 9/1998 | Tsuji et al. | 438/121 |
| 5,825,623 * | 10/1998 | Lee et al. | 361/707 |
| 5,843,808 * | 12/1998 | Karnezos | 438/121 |
| 5,854,511 * | 12/1998 | Shin et al. | 257/713 |
| 5,905,299 | 5/1999 | Lacap | 257/666 |
| 5,929,514 | 7/1999 | Yalamanchili | 257/676 |
| 5,936,837 | 8/1999 | Scribner et al. | 361/704 |
| 6,049,977 * | 4/2000 | Atkins et al. | 29/843 |
| 6,064,115 * | 5/2000 | Moscicki | 257/706 |
| 6,084,777 * | 7/2000 | Kalidas et al. | 361/707 |
| 6,093,960 * | 7/2000 | Tao et al. | 257/706 |

* cited by examiner

Primary Examiner—Alexander O. Williams
(74) Attorney, Agent, or Firm—Skjerven Morrill MacPherson LLP; Don C. Lawrence

(57) ABSTRACT

A thin, small-outline semiconductor package, and a thermally enhanced leadframe for use in it, comprise a plurality of electrically conductive leads held together in a spaced, planar relationship about a central opening defined by the leads, and a thick, plate-like heat sink made of an electrically and thermally conductive metal attached to the leads such that it is centered within the opening and parallel to the plane of the leads. The heat sink has a lower surface exposed through the outer surface of a molded resin envelope encapsulating the package for the efficient dissipation of heat therefrom, and an upper surface having a recess formed into it. The recess has a planar floor with a semiconductor die attached to it, and defines a grounding ring around the periphery of the upper surface of the heat sink immediately adjacent to the edges of the die for the down-bonding of grounding wires from the die and the leads. The package provides enhanced heat dissipating capabilities, an improved resistance to long-term penetration by moisture, and a down-bonding region that substantially shortens the length of grounding wires down-bonded thereto and substantially reduces the residual shear stress acting on the down-bonds.

17 Claims, 5 Drawing Sheets

US 6,198,163 B1

THIN LEADFRAME-TYPE SEMICONDUCTOR PACKAGE HAVING HEAT SINK WITH RECESS AND EXPOSED SURFACE

BACKGROUND OF THE INVENTION

1. Field of the Invention

This invention pertains to semiconductor packaging in general, and in particular, to a thin, leadframe-type of semiconductor package having an improved heat dissipating capability, improved resistance to penetration by moisture, and an improved down-bond capability by virtue of an enhanced leadframe therefor.

2. Description of the Related Art

Leadframe types of semiconductor packages are well known and widely used throughout the electronics industry to house, mount, and interconnect a variety of types of integrated circuits ("ICs"). An IC is typically formed on a single die, or "chip," that is cut from a semiconductor wafer containing a large number of identical dies. The dies themselves are relatively small and fragile, and are susceptible to harmful environmental elements, particularly moisture, and accordingly, must be packaged in affordable, yet robust, packages capable both of protecting them and permitting them to be reliably mounted to, for example, a printed circuit board ("PCB") and interconnected with associated electronic components mounted thereon.

One type of well known and widely used low-profile leadframe IC package is the so-called "thin shrink small outline package," or "TSSOP," which typically includes a plurality of leads on each of two sides of a thin, rectangular body. Other types of packages employing leadframes having leads on either two or all four sides of a rectangular body include "lead-on-chip" ("LOC"), "chip-on-lead" ("COL"), "small outline integrated circuit" ("SOIC"), "plastic dual in-line package" ("PDIP"), "shrink small outline package" ("SSOP"), "plastic leaded chip carrier" ("PLCC") and "quad flat package" ("QFP") packages.

A representative conventional leadframe 10 and two alternative semiconductor package 12 and 12' made from it are illustrated in FIGS. 5–8. The conventional leadframe 10 typically includes a plurality of electrically conductive leads 14 that are temporarily held together in a planar arrangement about a central opening 16 during package manufacture by a plurality of expendable longitudinal and lateral tie-bars 18 that form a rectangular frame enclosing the leads. A semiconductor die mounting pad 20 is supported within the central opening 16 by one or more die pad support leads 22. The leads 14 extend from a first end 26 integral with the rectangular frame to an opposite second end 24 adjacent to, but spaced from, the central opening 16. The longitudinal tie-bars 18 may include tooling or sprocket holes 28 for accurately positioning and/or advancing the leadframe during the package manufacturing process.

The conventional leadframe 10 is typically die-stamped from a sheet of flatstock metal, such as a copper or aluminum alloy, typically about 0.125–0.250 millimeters ("mm") in thickness, and may be deployed in the form of a strip of identical, interconnected leadframes, such as those illustrated in FIGS. 5 and 6, for either the sequential or simultaneous fabrication of a plurality of packages thereon.

During package manufacture, an IC die 30 is attached to the die pad 20, typically by solder, a layer of adhesive 32, or a double-sided adhesive tape. After the die is attached to the pad, wire-bonding pads 34 on top of the die are electrically connected to corresponding ones of the inner ends 24 of the leads 14 by fine, conductive bonding wires 36 to connect power, ground, and signals between the die and the leads. Additionally, some of the pads 34 that serve a grounding function may also be "down-bonded" to the die pad 20 by other conductive bonding wires 38 to ground the die to the die pad.

When wire-bonding is complete, each of the bonded assemblies is placed between the halves of a clam-shell mold (not illustrated) and a protective envelope 40, typically of a high density epoxy resin, is molded, usually by transfer-molding, over the assembly to enclose and seal the die 30, the inner ends 24 of the leads 14, and the wire bonds 36 and 38 against harmful environmental elements (see FIGS. 7 and 8). After molding, the temporary tie-bars 18 are cut away from the package 12 or 12' and discarded, their function having been assumed by the rigid epoxy envelope 40, and the outer ends 26 of the leads 14 are left exposed by the envelope 40 for interconnection of the package with other, associated circuitry (not illustrated).

A problem increasingly encountered in the semiconductor packaging industry today relates to the amount of heat experienced by the device during manufacture and assembly, as well as that generated by the device during operation, and the ability of the package to spread that heat uniformly and dissipate it to the environment effectively. As electronic devices grow more compact, yet faster and more functional, the problem increasingly becomes one of getting rid of more heat from packages that are the same, or increasingly, smaller in size, and this is generally the case not only for leadframe types of packages, but others as well.

It may be noted in the conventional leadframe package 12 illustrated in cross-section in FIG. 7 that the support leads 22 that support the die pad 20 within the central opening 16 have been given a "down-set," i.e., angled downwardly, such that the die pad 20 is vertically displaced below the plane of the leads 14. This down-set places the die 30 closer to the bottom of the package. Since the thermal resistance between the die and a heat-sinking surface 42 to which the package is mounted is proportional to the thickness of the material between them, this down-set reduces that resistance, thereby affording the package 12 a greater heat dissipating capability than packages without such a down-set.

The down-set die pad also provides two other, non-thermal benefits; namely, it reduces the overall height of the package 12, which is of interest to package designers faced with a requirement for thinner, more compact packages, and it also reduces the length of the bonding wires 36 extending between the die 20 and the leads 14 of the leadframe. In some applications, such as high-frequency and/or high-power applications, this reduction in conductor length improves the electrical performance of the packaged device.

The leadframe package 12' illustrated in FIG. 8 shows an alternate, "deep down-set" die pad embodiment in which the bottom surface of the die pad 20 is exposed through the bottom surface of the epoxy envelope 40. This not only further reduces the height of the package 12', the length of the bonding wires 36, and the thermal resistance between the die 30 and the surface 42 of a heat sink, but also enables the die pad 20 to be thermally coupled more directly to the heat sink surface by an efficient conductor of heat, for example, by a layer 44 of solder or a thermally conductive adhesive. Thus, this structure might be thought to represent an optimum solution for the problem of dissipating heat from a small outline, low-profile leadframe package. However, for the reasons discussed below, this configuration also creates some packaging problems that, to a large extent, offset the thermal benefits that it yields.

One of these relates to the resistance of the package to penetration by harmful moisture. It may be noted in the prior-art leadframe package 12' having an exposed die pad 20 shown in FIG. 8 that a seam 46 is defined at the interface of the die pad and the epoxy plastic envelope 40. Since a perfect adhesion between the die pad and the envelope along the entire length of the seam 46 is impractical, the seam may define the locus of one or more microscopic cracks for the entry of moisture.

So long as the moisture does not reach the die 30, this does not present an immediate problem. However, it does create a longer-term problem with repeated high-low temperature cycling of the device, in that any moisture trapped in the cracks at a low temperature will vaporize, and hence, expand, at a high temperature of the device, causing the microscopic cracks to open further and propagate around the edge of the die pad and more deeply into the package, until the cracks eventually reach the die, at which point the device can be rendered defective by moisture contamination of the die due to possible corrosion of metallizations and subsequent current leakage through the corrosive path.

Thus, the prior art leadframe package 12 without an exposed die pad illustrated in FIG. 7 exhibits a better resistance to penetration by moisture than does the package 12' illustrated in FIG. 8, although the latter exhibits a superior ability to dissipate heat from the die, for the reasons discussed above. Also, generally speaking, for packages that include an exposed die pad, the greater the length of the path between the die and the external boundary between the die pad and the plastic envelope, the greater is the resistance of the package to penetration by moisture over time. Therefore, while it is desirable on the one hand to position the die as closely as possible to a surface of the package for good heat dissipation, it is desirable on the other hand to position the die as remotely as possible from a surface of the package for good resistance to its penetration by moisture.

Another problem of conventional leadframe packages relates to the "down-bonds" 38 described above, i.e., the wire bonds made between the grounding pads on the die 30 and the upper surface of the die pad 20 to ground the die. As may be seen in the cross-sectional views of FIGS. 7 and 8, the down-bonds are made on a margin of the die pad that extends laterally beyond the edges of the die. The die is typically attached to the die pad by solder, or by a layer 32 of an adhesive, which is typically applied as a liquid. For manufacturing reasons, it is typical in either case for the attachment layer 32 to flow out on the surface of the die pad beyond the edges of the die, thereby preventing the down-bonds from being made immediately adjacent to the die, and necessitating their being made further outboard of it. This, in turn, results in an undesirable, and in some high-frequency applications, unacceptable lengthening of the down-bonded grounding wires 38. Accordingly, it is desirable to have a leadframe design that permits the down-bonded wires 38 to be made as short, and hence, as close to the edge of the die, as possible.

Another problem with prior-art leadframe packages also relates to the down-bonds, and the amount of residual shear stress present on the top surface of the die pad upon which the down-bonds are made. As described above, an epoxy resin envelope 40 is typically transfer-molded, at a relatively high temperature, e.g., 175–200° C., onto the leadframe after the die is wire-bonded to it. As a consequence of the relatively large differences in the respective thermal coefficients of expansion of the various materials of the package, e.g., epoxy resin, silicon, copper, aluminum, and the like, a widely-varying distribution of residual shear stresses is established at different locations within the package when it is cooled to room temperature.

This distribution of residual shear stress is very complex and includes so-called "neutral regions" where the shear stress is negligible and/or changes sign, and is closely dependant on the particular design of the package and the materials contained within it. However, certain generalizations can be made, including that the residual shear stress acting on the top surface of the die pad of a deep down-set die pad, and hence, on the down-bonds made thereat, is significantly greater than that acting on the wire bonds made to the leads of the package, because the latter wire bonds are made in a region of the package that is closer to the radius of curvature of the package, i.e., a neutral region where the residual shear stress is negligible.

As a result of the greater level of shear stress acting upon them, the down-bonds, which, like the wire bonds to the leads of the package, are typically ultrasonic "stitch," or thermosonic "crescent," bonds, are subject to a much higher incidence of de-lamination from the die pad, i.e., bond failure, than the bonds made to the leads. And, as above, while it is possible to reduce the level of shear stress on the down-bonds by moving the top surface of the die pad closer to the plane of the leads, this has the retrograde effect of moving the die further away from the surface of the heat sink, and hence, increasing the thermal resistance between the two.

Therefore, there is need for a thin, affordable, small-outline leadframe semiconductor package that provides an enhanced heat dissipating capability, an improved resistance to penetration by moisture, and a down-bond region immediately adjacent to the edges of the die that minimizes the length of down-bonded wires and subjects the down-bonds to a minimum of residual shear stress.

SUMMARY OF THE INVENTION

This invention includes a thin, affordable, small-outline leadframe semiconductor package, and a leadframe for it, that provide an enhanced heat dissipating capability, an improved resistance to penetration by moisture, and a down-bond region immediately adjacent to the edges of the die that minimizes the length of down-bonded grounding wires and subjects the down-bonds to a minimum of residual shear stress.

The novel leadframe of the invention conventionally comprises a plurality of electrically conductive leads that are temporarily held together by a frame comprising a plurality of expendable frame members in a spaced, planar relationship about a central opening defined by the leads. Each of the leads has an inner portion that extends toward the central opening, and an outer portion that extends away from it.

The leadframe also comprises a separate, plate-like heat sink that attaches to the leads and is made of a material that has good electrical and thermal conductivity. In one embodiment the heat sink is attached to the leadframe by staking it to two or more support members located on opposite sides of the central opening such that it is held centered within the central opening and parallel to the plane of the leads.

The heat sink has a first, upper surface having a recess in it, and a second, lower surface that can be exposed through the outer surface of a molded resin envelope of the semiconductor package. The recess has a floor disposed below and generally parallel to the upper surface of the heat sink for the attachment of a semiconductor die thereto. The remainder of the upper surface defines a grounding ring around the periphery of the heat sink that is immediately adjacent to the edges of the die.

In the low-profile semiconductor package incorporating the enhanced leadframe, a semiconductor die is attached to the floor of the recess and the die is wire-bonded to corresponding ones of the inner portions of the leads and to the grounding ring.

The inner ends of the leads, the heat sink, the die, and the bonding wires are encapsulated in an envelope of insulative plastic so that only the outer ends of the leads and at least a portion of the lower surface of the heat sink are left exposed to the exterior of the package.

The invention thus provides a semiconductor package having an enhanced heat dissipating capability by virtue of a heat sink having a recess that places the die very close to a heat sinking surface at an exterior surface of the package, yet which increases the path length between the die and the external surface of the package, thus improving the resistance of the package to penetration by moisture. Moreover, the recess in the heat sink defines a down-bonding region that is isolated from the die-attachment surface of the heat sink, thereby preventing contamination of the down-bonds by a die-attachment adhesive, thus permitting the down-bonds to be made much closer to the edges of the die and shortening the length of the wires down-bonded thereto. Additionally, the recessed heat sink positions the down-bonding surface of the heat sink closer to the plane of the leads, a region of negligible residual shear stresses, thereby significantly improving down-bond reliability.

A better, more detailed understanding of these and other features and advantages of the present invention may be obtained from the detailed description that follows below, together with the associated drawings thereof.

DETAILED DESCRIPTION OF THE INVENTION

Figure 1:
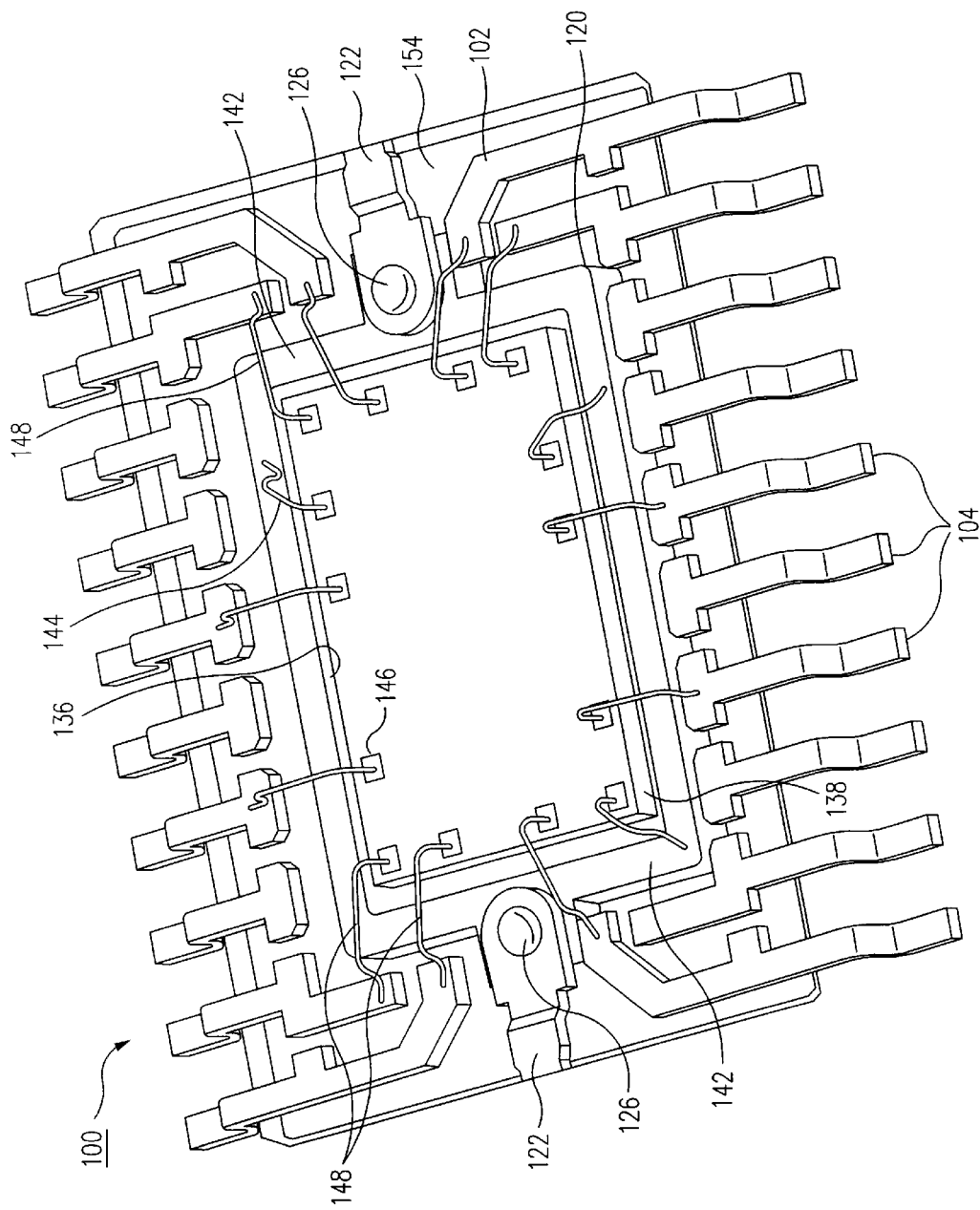
FIG. 1 is an isometric view of a low-profile semiconductor package having an improved heat dissipating capability and incorporating an enhanced leadframe, both in accordance with the present invention.

FIG. 1 is an isometric view of a thin, small outline, thermally enhanced leadframe semiconductor package 100 in accordance with one embodiment of the present invention revealing its constituent parts, comprising a novel, enhanced leadframe 102 therefor. The package 100 and its constituent parts, including the leadframe 102, are shown in an exploded isometric view in FIG. 2. The package illustrated in the figures corresponds to a standard, 20-lead TSSOP having 10 leads on opposite sides thereof. However, it should be understood that this particular configuration is illustrated for exemplary purposes only, and that the invention is not limited to such, but indeed, is applicable to a wide variety of package forms, including those having more or fewer leads on either two or four sides thereof.

Figure 2:
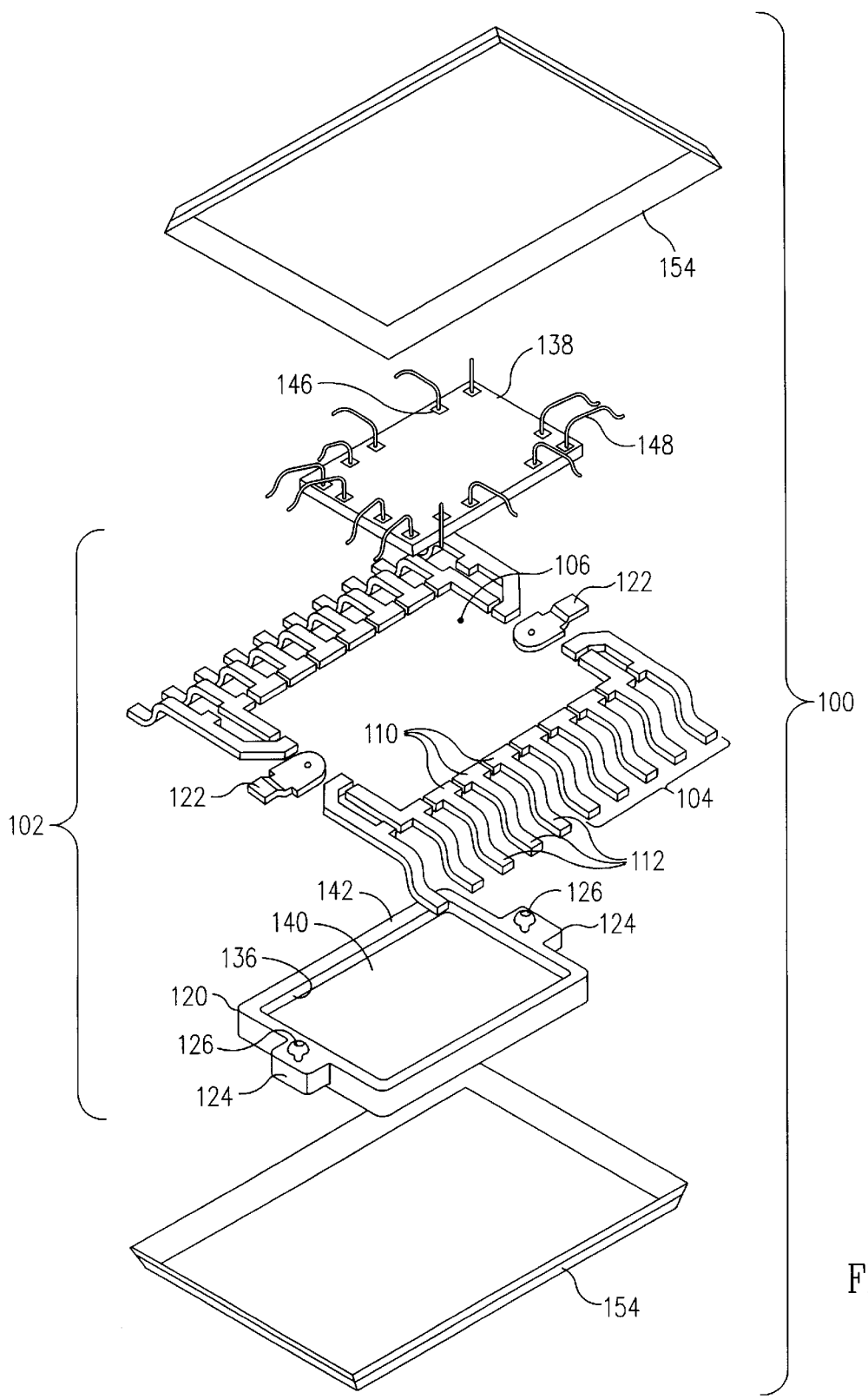
FIG. 2 is an exploded isometric view of the semiconductor package shown in FIG. 1.
Figure 3:
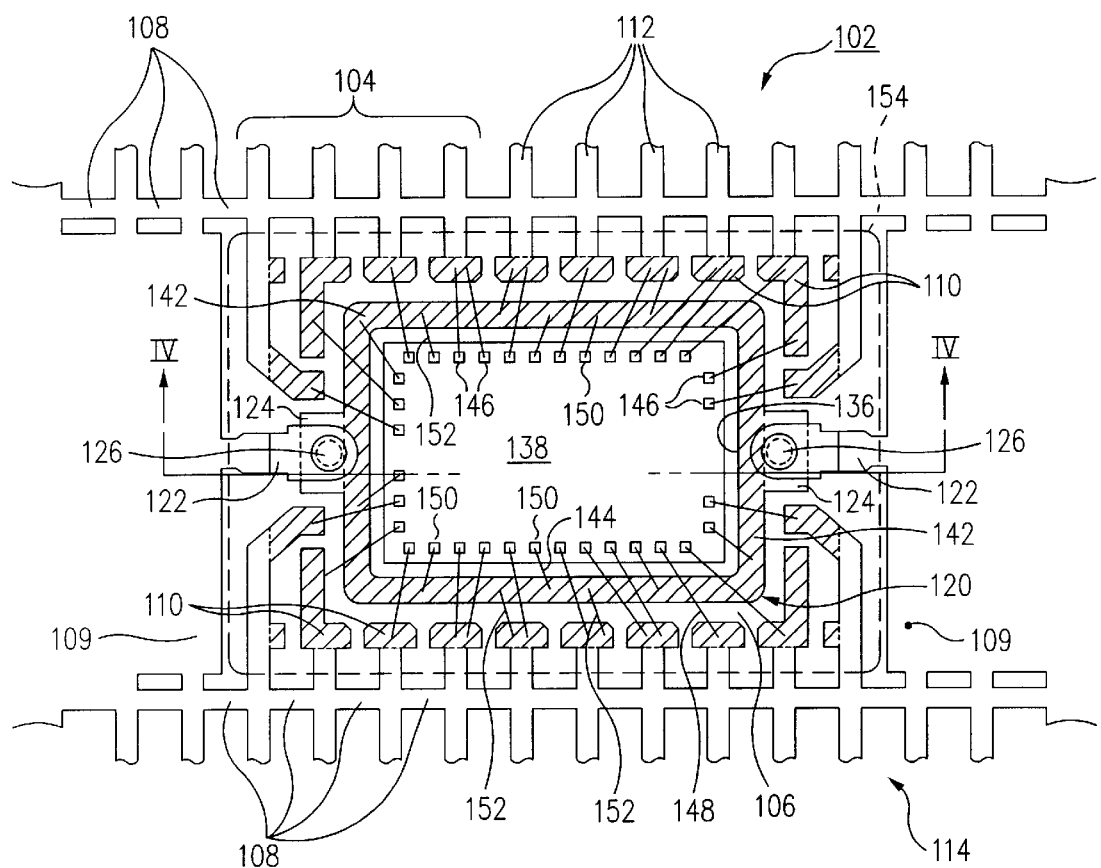
FIG. 3 is a plan view of the enhanced leadframe of the present invention.

FIG. 3 is a plan view of the leadframe 102, which conventionally comprises a plurality of electrically conductive leads 104. The leads define a central region having an opening 106 (see FIG. 2), and are temporarily held together in a spaced, planar arrangement about the opening by a rectangular frame comprising two pairs of expendable longitudinal and lateral frame members 108 and 109 (see FIG. 3). Each of the leads 104 comprises an inner portion 110 and an outer portion 112 extending in opposite directions from the two parallel frame members 108. The inner portion 110 has a first end integral with the frame member and an opposite, second end adjacent to the central opening 106. The outer portion 112 of the lead has a first end integral with the frame member 108, and an opposite, second end that extends to an expendable outer member (not illustrated) of the frame. In FIGS. 1 and 2, the package 100 and the leadframe 102 are shown after the frame members 108 and 109 have been removed, by a process described in more detail below.

In the embodiment illustrated in FIG. 3, the leadframe 102 comprises one of a plurality of identical leadframes attached end-to-end in a strip 114, and may be deployed in that form for the sequential or simultaneous manufacture thereon of a plurality of semiconductor packages 100. Following completion of their fabrication process, the individual packages 100 are separated from the strip 114 and from each other by a cutting operation that simultaneously removes the frame members 108 and 109 from the leads 104 and bends the outer portions 112 of the leads into the desired mounting configuration, such as the surface-mounting configuration illustrated in FIGS. 1 and 2.

The strip 114, comprising the frame 108 and the leads 104, with their respective inner and outer portions 110, 112 completely defined thereon, are simultaneously formed, e.g., by die-stamping them from a sheet, or flat-stock, of an electrically conductive metal, such as a copper, aluminum, or nickel-iron (e.g., Kovar) alloy. As shown by the cross-hatched areas in FIG. 3, the inner portions 110 of the leads 104 are plated with a material that facilitates the making of wire bonds to the leads, e.g., silver, gold, platinum, nickel, or a layered combination of the foregoing metals.

Figure 4:
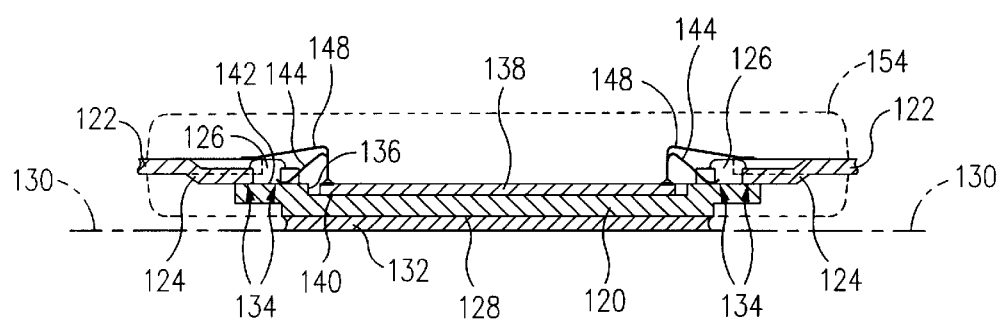
FIG. 4 is a cross-sectional elevation view into the leadframe shown in FIG. 3, as revealed by the section taken in FIG. 3 along the lines IV—IV.
Figure 5:
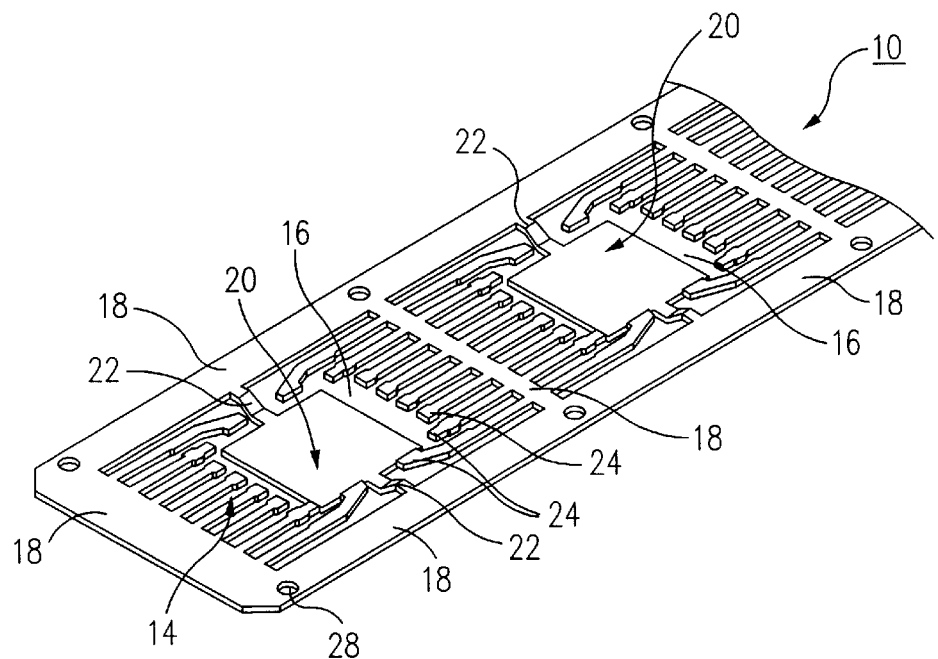
FIG. 5 is an isometric view of a strip of connected prior art leadframes.
Figure 6:
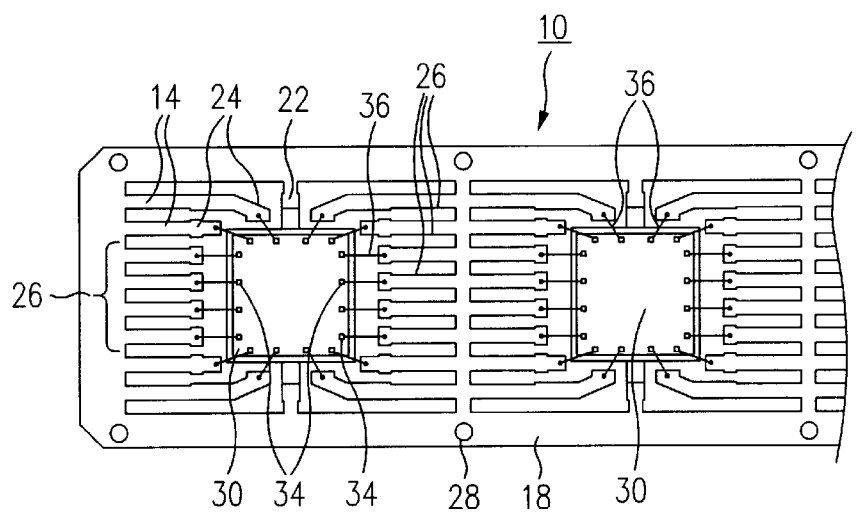
FIG. 6 is a plan view of the strip of prior art leadframes shown in FIG. 5; and, FIGS. 7 and 8 are cross-sectional elevation views of two embodiments of semiconductor packages incorporating the prior art lead frames shown in FIGS. 5 and 6.
Figure 7:
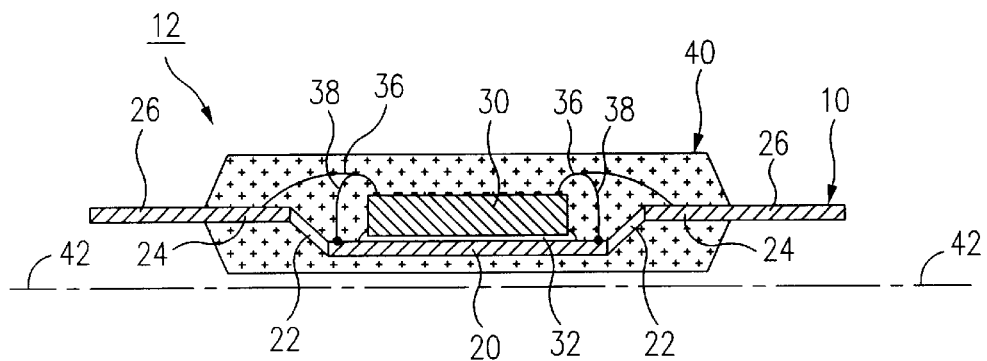
Figure 8:
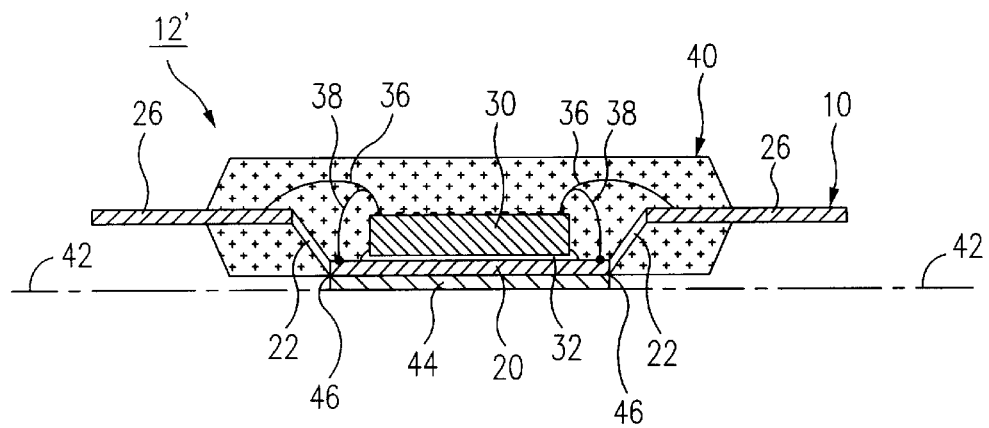

The leadframe 102 also comprises a separate, plate-like "heat slug," or "heat sink," 120 that is attached to the leadframe and made of a material that is both electrically and thermally conductive, e.g., a soft, oxygen-free copper, or alloy thereof. In the embodiment illustrated in FIGS. 1–4, the heat sink 120 is attached to the leadframe by staking it to two or more support members 122 extending from the frame members 109 on opposite sides of the central opening 106 such that it is held centered within the central opening 106 and parallel to the plane of the leads 104 (see FIGS. 3 and 4). The vertical position of the heat sink relative to the leads may be adjusted such that it is held above, below, or coplanar with the plane of the leads by adjusting the amount of up-set or down-set formed in the support members 122 supporting it. As shown in FIG. 4, the support members 122 have been formed with a slight down-set.

By providing a heat sink 120 that is separate and distinct from the leads 104, it can be made thicker, e.g., 0.3–0.5 mm in thickness, and can incorporate certain advantageous features described below that are not possible in a conventional die pad that is stamped along with the leads from a thin sheet of flat-stock, such as the die pads 20 in the conventional lead frames 10 illustrated in FIGS. 5–8. Of course, it is theoretically possible to stamp conventional leadframes 10 from a thicker stock of material, but this quickly becomes impractical with increasing thicknesses for cost, increased package profile, and other manufacturing reasons.

The heat sink 120 is formed to include the mechanical features described below by, e.g., coining a blank, or "coupon," of a soft metal, e.g., copper, between two precision-made steel dies. However, it can also be fabricated by a number of other methods as well, including forging, hydro-forming, electrical-discharge-machining ("EDM"), or as a precision die- or investment-casting.

In the embodiment illustrated in the figures, the heat sink 120 is shown attached to the leadframe 102 by staking it to the support members 122, i.e., by forming, e.g., by punching, a small, upstanding stake, or pin, on each of two or more corresponding mounting ears 124 located on opposite sides of the heat sink, inserting each of the stakes into an aperture in a corresponding support member 122, and upsetting the upper ends of the stakes to form a head 126 thereon that securely fastens the heat sink to the leadframe. However, the heat sink 120 can also be attached to the leadframe 102 by other methods, including by riveting, brazing, welding, soldering, or by adhering it thereto with an adhesive. The heat sink 120 can also be attached to other numbers of support members 122 arranged around the periphery of the central opening 106 besides the two illustrated.

The heat sink 120 has a first, upper surface 134, and a second, lower surface 128 opposite thereto that is exposed through and flush with the outer surface of the package 100 for the efficient dissipation of heat from the package and into a surface 130 of, e.g., a heat sink on a PCB to which the package is mounted (see FIG. 4).

In one mounting embodiment, the second, lower surface 128 of the heat sink 120 is soldered to a PCB with a layer of solder 132. However, it should be understood that the package 100 of this invention is not limited to that particular mounting technique. Thus, for example, the outer portions of the leads 104 of the package can be bent in the opposite direction from that shown in FIGS. 1 and 2, so the package 100 mounts to a PCB with the first, lower surface 128 of the heat sink 120 facing up away from the PCB, for contact thereby, for example, a heat sink cooled by a fan or a thermoelectric cooler.

Importantly, the first, upper surface 134 of the heat sink 120 includes a recess 136 formed into it for the attachment of a semiconductor die 138 therein. The recess 136 has a planar floor 140 disposed below and generally parallel to the first surface 134 of the heat sink. The die 138 is attached to the floor 140 of the recess with, e.g., an adhesive, or by soldering it thereto. The first surface 134 of the heat sink also defines a grounding ring 142 around the periphery of the recess 136 that is immediately adjacent to the edges of the die 138 mounted in the recess, and hence, particularly well adapted for the making thereto of extremely short down-bonds of grounding wires 144 extending from the die. For this purpose, the grounding ring 142 is plated with a metal, e.g., silver, gold or platinum, that facilitates wire bonding to it, as indicated by the cross-hatching shown in FIG. 3.

The dimensions of the heat sink 120 will vary, depending upon the dimensional, thermal, lead-pitch and other design constraints of the particular package involved. In the exemplary 20-lead TSSOP package 100 shown in FIGS. 1–4, the heat sink 120 is 4.2 mm long×3.0 mm wide×0.3 mm thick, has an exposed first, lower surface that is 4.2 mm long×3.0 mm wide (12.6 mm$^2$), a grounding ring 142 that is 0.254 mm wide extending around the entire periphery of the recess 136, and the recess can accommodate a die 138 that is up to 3.43 mm long×2.23 mm wide×0.46 mm thick. The body of the resulting "high-power" TSSOP package 100 incorporating the leadframe 102 is 6.450 mm long×4.400 mm wide×0.900 mm high, and the leads 104 are set at a pitch of 0.65 mm.

The advantages of the relatively thicker heat sink 120, when combined with the recess 136 in its first, upper surface 134, are several. It will be understood from the above discussion that the effect of using a heat sink 120 that is thicker than a conventional thin die pad 20, such as those illustrated in FIGS. 5–8, is to position the die 138 higher in the package 100 than do the latter. While this re-positioning of the die increases the thickness of the material between the die and a heat-sinking surface 130, such as that illustrated in FIG. 4, and hence, the thermal resistance between the two, it also increases the distance that moisture must penetrate into the package 100 to reach the die 138, thereby decreasing the sensitivity of the package to penetration by moisture. The thicker heat sink 120 also places the down-bonding upper surface 124 of the heat sink closer to the plane of the leads 104, where the residual shear stress acting on the down-bonds is negligible, thereby substantially improving the reliability of the down-bonds.

The recess 136 then contributes the following additional advantages to the above configuration. Initially, the recess "re-positions" the die 138 in the package 100 to about that occupied by a die in a conventional, deep down-set package, but without lowering the grounding ring 142 defined by the recess on the first, upper surface 134 of the heat sink where the down-bonds are made. This reduces the thermal resistance between the die and the heat-sinking surface 130 to about that of a thin die pad, while lowering the upper surface of the die until it is about coplanar with the grounding ring 142, thereby desirably reducing not only the height of the package 100, but also the length of the down-bonded grounding wires 144 to less than the length of such wires bonded to a heat sink without a recess. It also effectively increases the distance that moisture must penetrate into the package 100 to reach the die 138, thereby further increasing the resistance of the package to long-term penetration by moisture to more than four times that of conventional leadframe packages. In this regard, it may also be noted that, in comparison to a conventional leadframe, the separately attached heat sink 120 with a recess in it defines more and larger mechanical features on its surface that serve to increase the area of adhesion between the leadframe and a plastic envelope molded over it, thereby "locking" the leadframe more securely in the plastic and further increasing the resistance of the package 100 to penetration by moisture.

In addition to the above, the recess 136 defines a "moat" between the edges of the die 138 and the grounding ring 142 that prevents an excess of solder or adhesive used to attach the die to the floor 140 of the recess from flowing out onto the down-bonding grounding ring and contaminating it against the formation thereon of down-bonds. This means that the down-bonds can be made immediately adjacent to the edges of the die, rather than further outboard of them, as is necessary in conventional leadframe packages, and hence, that the length of the down-bonded grounding wires 144 is desirably reduced even further.

Another advantage of the recess 136 is that it interrupts the first, upper surface 134 of the heat sink 120, and hence, the "flow" of residual shear stresses acting on that surface, thereby further reducing the shear stress acting on the down-bonds. Indeed, a comparison of thermal stress analyses performed on two equally thick heat sinks, both adapted for use in a TSSOP package, one with a recess in it, the other without, shows that the residual shear stress acting on the upper surface of the heat sink with a recess in it is about 33% less than that acting on the upper surface of the equally thick heat sink without a recess. A similar comparison between the recessed heat sink 120 and a thin (0.127 mm thick) TSSOP die pad of the prior art shows that the residual shear stresses acting on the down-bonds on the recessed heat sink are about 70% less than those acting on the conventional die pad.

In the manufacture of a low-profile semiconductor package 100 incorporating the enhanced leadframe 102, a semiconductor die 138 is attached to the floor 140 of the recess 136 using, e.g., a filled, thermally conductive epoxy adhesive. Wire-bonding pads 146 on the upper surface of the die are then wire-bonded to corresponding ones of the inner portions 110 of the conductive leads 104 by fine conductive wires 148 to allow signals and power to be transmitted between the die and the leads. Grounding pads 150 on the die are down-bonded to the grounding ring 142 on the heat sink using wires 144 to ground the die 138. If desired, additional grounding wire bonds 152 can be made from the grounding ring 142 to selected ones the leads 104.

The inner portions 110 of the leads 104 and the heat sink 120, with the wire-bonded die 138 mounted thereon, are then placed between the halves of a clam-shell mold (not illustrated), and a protective envelope 154 (shown dotted in FIGS. 3 and 4) of an insulative plastic, e.g., a molten epoxy resin, is molded over them so that only the outer portions 112 of the leads and at least a portion of the lower surface 128 of the heat sink 120 are left exposed. The envelope 154 seals and protects the encapsulated parts against the environment. The package is then finish-processed as described above, in which the temporary frame members 108 and 109 are removed and discarded, the leads 104 bent into the desired mounting configuration, and the individual packages 100 separated from the leadframe strip 114.

This invention provides a thin, affordable small-outline semiconductor package, and a thermally enhanced leadframe for use in it, that yield enhanced heat dissipating capabilities, an improved resistance to long-term penetration by moisture, and a down-bond region that substantially shortens the length of grounding wires down-bonded thereto, and subjects the down-bonds to a minimum of residual shear stress. Those skilled in the art will recognize that many advantageous modifications to the invention are possible in terms of its materials and methods. Accordingly, the particular embodiments of the invention illustrated and described herein should be understood as exemplary in nature only, and not as limitations on the scope of the invention, which is defined instead by that of the claims appended hereafter.

What is claimed is:

1. A leadframe for a semiconductor package, comprising:
    a frame, including a central region within the frame;
    a plurality of metal leads extending in a common, horizontal plane from an outer portion integral with the frame to an inner portion adjacent to the central region;
    a plate disposed in the central region and parallel to the plane of the leads, the plate including a first surface and an opposite, second surface;
    wherein the first surface of the plate is closer to the plane of the leads than the second surface;
    wherein the first surface of the plate includes a recessed planar central portion and a peripheral portion surrounding the central portion, the peripheral portion being vertically closer to the plane of the leads than the central portion and defining a conductor down-bonding surface that is parallel to and spaced apart vertically from the plane of the leads; and,
    wherein the down-bonding surface is plated with a metal to facilitate the making of wire bonds thereto.

2. The leadframe of claim 1, further comprising two or more support members extending from the frame and connected to the metal plate.

3. The leadframe of claim 2, wherein the frame is rectangular and has a first pair of parallel frame members and a second pair of parallel frame members perpendicular to the first pair of frame members; and,
    wherein the leads extend from the first pair of frame members and the two or more support members extend from the second pair of frame members.

4. The leadframe of claim 2, wherein the two or more support members are formed to position the plate above, below or coplanar with the plane of the leads.

5. The leadframe of claim 1, wherein at least one of the inner portions of the leads and the peripheral portion of the first surface of the plate is plated with silver, gold or platinum.

6. The leadframe of claim 1, wherein at least one of the plurality of leads and the plate is made of an alloy of copper, aluminum, or iron-nickel.

7. The leadframe of claim 2, wherein the two or more support members are connected to the plate by a stake, a rivet, a weld, solder, or an adhesive.

8. The leadframe of claim 1, wherein the plurality of leads and the plate comprise a single unit in a plurality of identical units attached end-to-end in the form of a strip for the simultaneous or sequential processing of a plurality semiconductor packages thereon.

9. A semiconductor package, comprising:
    a package body formed of an insulative encapsulating material;
    a plurality of metal leads lying in a common plane, each lead having a first portion within the package body and a second portion extending outside of the package body;
    a plate disposed within the package body, the plate including a first surface adjacent to the first portions of the metal leads and an opposite second surface, the first surface of the plate having a planar central portion and a peripheral portion surrounding the central portion, the central portion being recessed below the peripheral portion, and the peripheral portion defining a conductor down-bonding surface that is parallel to and spaced apart perpendicularly from the plane of the leads;
    a semiconductor die attached to the recessed central portion of the plate;
    one or more conductors electrically connecting the die to the first portions of the leads; and,
    one or more conductors electrically connecting the die to the peripheral portion of the plate.

10. The semiconductor package of claim 9, further comprising one or more conductors electrically connecting the peripheral portion of the plate to the inner portions of the leads.

11. The semiconductor package of claim 9, further comprising two or more support members lying in the plane of the leads and connected to the plate.

12. The semiconductor package of claim 11, wherein the two or more support members are formed to position the plate above, below, or coplanar with the plane of the leads.

13. The semiconductor package of claim 11, wherein the two or more support members are connected to the plate by a stake, a rivet, a weld, solder, or an adhesive.

14. The semiconductor package of claim 9, wherein the second surface of the plate is exposed through the package body.

15. The semiconductor package of claim 9, wherein the package body comprises an epoxy resin.

16. The semiconductor package of claim 9, wherein at least one of the inner portions of the leads and the peripheral portion of the first surface of the plate is plated with a layer of material that facilitates the making of wire bonds thereto.

17. The semiconductor package of claim 9, wherein the plurality of metal leads and the plate comprise a single unit in a plurality of identical units attached end-to-end in the form of a strip for the simultaneous or sequential processing of a plurality semiconductor packages thereon.

* * * * *